United States Patent
Basten

(10) Patent No.: US 7,889,003 B2
(45) Date of Patent: Feb. 15, 2011

(54) CLASS-D AMPLIFIER

(75) Inventor: Roland Basten, Oosterhout (NL)

(73) Assignee: NXP B.V., Eindhoven (NL)

( * ) Notice: Subject to any disclaimer, the term of this patent is extended or adjusted under 35 U.S.C. 154(b) by 34 days.

(21) Appl. No.: 12/514,808

(22) PCT Filed: Nov. 14, 2007

(86) PCT No.: PCT/IB2007/054635
§ 371 (c)(1),
(2), (4) Date: May 14, 2009

(87) PCT Pub. No.: WO2008/059452
PCT Pub. Date: May 22, 2008

(65) Prior Publication Data
US 2010/0066446 A1    Mar. 18, 2010

(30) Foreign Application Priority Data
Nov. 17, 2006   (EP)   ................... 06124326

(51) Int. Cl.
*H03F 3/217*   (2006.01)
(52) U.S. Cl. .................... 330/251; 330/207 A; 330/262
(58) Field of Classification Search ................. 330/251, 330/207 A, 262
See application file for complete search history.

(56) References Cited

U.S. PATENT DOCUMENTS

| | | | |
|---|---|---|---|
| 4,117,415 A | 9/1978 | Hoover | |
| 4,706,035 A | 11/1987 | Dijkmans et al. | |
| 5,999,001 A * | 12/1999 | Kuhara et al. | ............... 324/322 |
| 6,107,875 A * | 8/2000 | Pullen et al. | .................. 330/10 |
| 6,496,068 B1 | 12/2002 | Eddlemon | |
| 6,563,377 B2 * | 5/2003 | Butler | ......................... 330/10 |
| 7,245,165 B2 * | 7/2007 | De Langen | ................. 327/170 |
| 7,285,992 B1 * | 10/2007 | Maida | ......................... 327/112 |
| 7,312,654 B2 * | 12/2007 | Roeckner et al. | .............. 330/10 |
| 7,315,151 B2 * | 1/2008 | Thompson et al. | .......... 323/223 |
| 2003/0184379 A1 | 10/2003 | Ivanov et al. | |
| 2005/0218988 A1 | 10/2005 | Berkhout | |

FOREIGN PATENT DOCUMENTS

EP         1003279 A       5/2000

\* cited by examiner

*Primary Examiner*—Patricia Nguyen

(57) ABSTRACT

The invention describes a power amplifier comprising a first transistor ($M_{HS}$) having a first control terminal and a first main current path coupled between a first supply terminal (Vdd) and a first node (VH), a second transistor ($M_{LS}$) having a second control terminal and a second main current path coupled between a second supply terminal (Vss) and a second node ($V_L$), a first controlled resistor ($M_{HC}$) coupled between the first node and an output node (Vout) of the amplifier, a second controlled resistor ($M_{LC}$) coupled between the second node and the output node (Vout) of the amplifier, the first transistor being controlled by a first driver comprising a level shifting circuit, and the second transistor being controlled by a second driver including a time delaying circuit.

18 Claims, 3 Drawing Sheets

CLASS-D AMPLIFIER

FIELD OF THE INVENTION

The invention relates to a class-D amplifier.

BACKGROUND OF THE INVENTION

Class-D amplifiers are very much used in modern devices because of their high efficiency. A general class D output stage comprises a high-side switch $M_H$ and a low-side switch $M_L$, as shown in FIG. 1a. Output signal will be pulses having a maximum value equaling the positive supply voltage Vdd and a minimum value equaling the negative one i.e. Vss. In general, the maximum supply voltage of the output stage equals the maximum process voltage and often the gate breakdown voltage dictates it. The source to drain voltage can handle a larger voltage. When the supply voltage has to be larger than this maximum process voltage a cascoded output stage may be used as shown in FIG. 1b. Two cascoded transistors have been added i.e. $M_{LC}$, $M_{HC}$, which will distribute the supply voltage over two MOS transistors. When the output voltage equals the positive supply voltage Vdd the voltage is divided over $M_{LS}$ and $M_{LC}$. When the output voltage equals the negative supply voltage Vss the voltage is divided over $M_{HS}$ and $M_{HC}$. Several solutions for the single transistor solution, FIG. 1a, are already known. The transistors should be driven in such a way that there is no cross current; short circuits between the supply voltages Vdd-Vss due to the fact that both high-side and low-side transistors are switched on. Currently, three solutions may be used for solving this problem:
1. Add a delay time between the high-side drive signal Input high in FIG. 1a and the low-side drive signal Input low. Now, first the low-side power transistor $M_L$ will be turned off; then wait to be sure that it is off; then turn on the high-side transistor ($M_H$), and vice versa.
2. Using handshake signals Detection circuits at the power transistors ($M_L$ end $M_H$) generates signals that indicate when these transistors are switched on or off. This signal will be used to drive the opposite transistor.
3. Using zero dead time as shown in US-A-2005/0218988.

Solutions one and two have a disadvantage that they will add dead time to the system; a moment that both power transistors $M_L$ and $M_H$ are switched off. This will result in worse performance e.g. in audio amplifiers an increase of THD.

Using cascoded output stages like in FIG. 1b, the flank of the output signal is not controlled in one of the above-mentioned solutions, which will end up in an increase of higher harmonic signals resulting in EMI problems. Furthermore, the reference voltages VtabL and VtabH have to handle large spike currents during output transitions.

Current solutions have some drawbacks; due to the uncontrolled output slope one has to deal with large distortions and EMI problems. Also, the charge and discharge of the cascoded transistors will be very fast resulting in large current spikes at the gate of the cascoded transistors. The cascoded transistors are connected to an internal bias voltage source. In order to not lift up these bias voltages too much, the output impedance of this bias voltage source has to be low. It will cost supply current.

FIG. 2 shows the simulation results of the current driver technique of the solution presented in US-A-2005/0218988.

First, consider a single power output stage like having a switching with zero dead time as described in US-A-2005/0218988A1. Inverters Mdlr/Mdls and Mdhr/Mdhs drive the power transistors shown in FIG. 3, $M_L$ and $M_H$. To guarantee no cross currents with zero dead time the dimension of the inverters are critical. Several operating areas can be determined during the switching of the output. For this example no load has been connected to the output. Starting with the drive voltage Vdrive high and therefore the output voltage high Vout is about Vdd. Switching the output low i.e. Vout equals Vss, the drive voltage Vdrive will be set low at $t_0$. The total gate capacitor $C_{gsh}$ of the high side power transistor $M_H$ has to be discharged while the total gate capacitor $C_{gsl}$ from the low side power transistor $M_L$ has to be charged in the same time. The discharge of the high side parasitic capacitor $C_{gsh}$ will be with a voltage range from the maximum voltage to the threshold voltage of the high side power transistor $M_H$. The charge of the low side capacitor $C_{gsl}$ will be from Vss to the threshold voltage of the low side transistor $M_L$. This will determine the ratio of the driver components $M_{dhr}$ and $M_{dls}$ of high side discharge and low side charge. Now, the high side transistor $M_H$ is just turned off and the low side turned $M_L$ on, the output voltage Vout can be switched to Vss. This is done by the current of the charge driver of the low side transistor $I_{d,Mdls}$ and the gate drain capacitor $C_{dgl}$ of the low side transistor ($M_L$), a linear output transition occur $$\left(\frac{dVout}{dt} = \frac{I}{C}\right).$$

The gate voltage of the low side transistor $M_L$ will stay at the threshold voltage $V_{TL}$.

Finally, the gate voltage of the low side will rise till it's maximum voltage Vdd resulting in a minimum on-resistance of the power transistor $M_L$. Switching the output voltage Vout from Vss to Vdd will follow the same procedure. When the current of the drivers are independent of the supply voltage, the output transition dV/dt will be independent of the supply voltage.

SUMMARY OF THE INVENTION

Hence, it is a need to provide a power amplifier having a linear output voltage change and therefore a reduced EMI. The invention is defined by the independent claims. Dependent claims define advantageous embodiments.

This object is obtain in a power amplifier comprising:
 a first transistor having a first control terminal and a first main current path coupled between a first supply terminal and a first node,
 a second transistor having a second control terminal and a second main current path coupled between a second supply terminal and a second node,
 a first controlled resistor coupled between the first node and an output node of the amplifier,
 a second controlled resistor coupled between the second node and the output node of the amplifier,
 the first transistor being controlled by a first driver comprising a level shifting circuit, and
 the second transistor being controlled by a second driver including a time delaying circuit.

In the known solution, for having a constant output change dV/dt, which is independent of the supply voltage, the driver currents should be independent of the supply voltage. This means that the driving signals of the drivers of the power transistors should have a fixed value. For that the drive signal is shifted to a higher level for driving the high side power transistor. A level shifter achieves this. However this will also add some delay for the driving signal of the high side driver circuit. Therefore, a timing delay in the low side path is added to compensate for this effect.

In an embodiment of the invention, the power amplifier further comprises a first capacitor coupled between the first controlled terminal and the output node, the amplifier comprising a second capacitor coupled between the second controlled terminal and the output node. Now, respective charge currents of the drivers control the output voltage. First, it charges either the first capacitor or the second capacitor till the opposite cascode transistor is switched off. Secondly, it charges both said capacitors and the total gate capacitor of the driven switch transistor resulting in two different slopes of the output voltage change.

In another embodiment of the invention, the power amplifier further comprises a first capacitor coupled between the first controlled terminal and the second node, the amplifier comprising a second capacitor coupled between the second controlled terminal and the first node. The flank of the output voltage was already controlled in the previous embodiment, also with zero dead time techniques. Still, an improvement can be made. Switching the output signal of the power amplifier from high to low, results that the high side switch transistor is switched off and the low side switch transistor is switched on and the high side cascode transistor is still in its linear region. The bend in the output voltage is at the moment the low side cascode transistor goes into the linear region. Using this effect the output voltage can be completely controlled by providing said capacitors. Preferably, the values of these capacitors are matched to the gate-drain capacitors of the switching transistors. This will result in a linear output voltage change, where the driver current may control the slope.

In an embodiment of the invention the first and the second driver comprises a respective first and second controlled current source coupled to the respective level shifting circuit and to the delaying circuit, the first controlled current source providing current to the second node and to the first node and the second controlled current source providing current to the first node and to the second node. The voltage at the first and the second node may increase because of the capacitive division between the first and the second capacitor and the parasitic capacitance of the transistors during output voltage transitions. Therefore, a small current may be subtracted from said nodes foe avoiding such an increase. The controlled current sources achieve this object.

Preferably, the controlled resistors are MOS transistors, but also bipolar ones can be also used. The first current source is coupled to the level shifting circuit via a first inverter and wherein the second current source is coupled to the delaying circuit via a second inverter.

BRIEF DESCRIPTION OF THE DRAWINGS

The above and other advantages will be apparent from the exemplary description of the accompanying drawings in which.

DETAILED DESCRIPTION OF EMBODIMENTS

Figure 3:
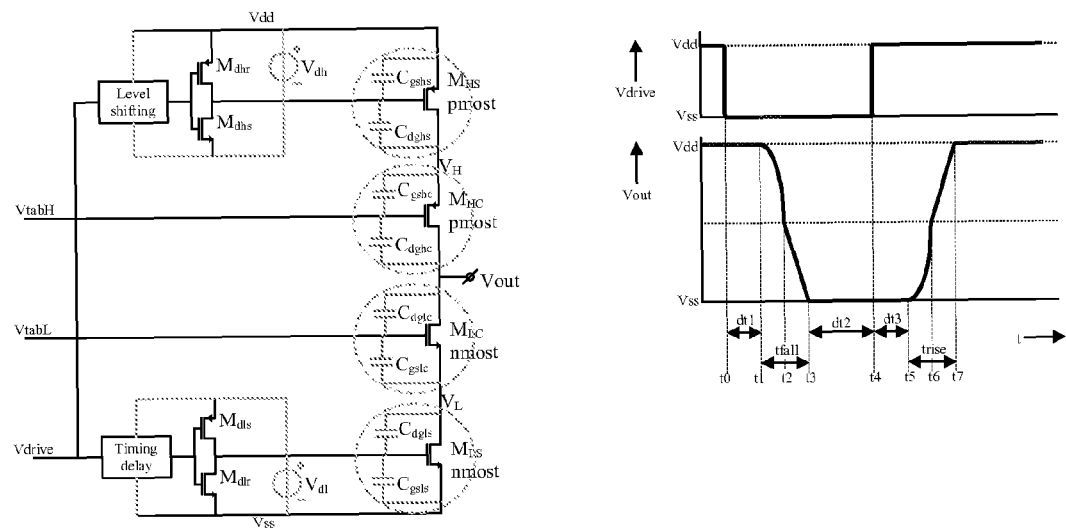
FIG. 3 depicts a power amplifier according to the invention.

FIG. 3 depicts a power amplifier according to the invention comprising a first transistor $M_{HS}$ having a first control terminal and a first main current path coupled between a first supply terminal Vdd and a first node $V_H$. The amplifier further comprises a second transistor $M_{LS}$ having a second control terminal and a second main current path coupled between a second supply terminal Vss and a second node $V_L$. A first controlled resistor $M_{HC}$ is coupled between the first node and an output node (Vout) of the amplifier. A second controlled resistor $M_{LC}$ is coupled between the second node and the output node Vout of the amplifier. A first driver comprising a level shifting controls the first transistor circuit, and the second transistor being controlled by a second driver including a time delaying circuit.

When compared with the prior-art power amplifier, the amplifier shown in FIG. 3 has about the same operating areas during switching. An extra area is been added t1, t2. Between t1 and t2 high side switching power transistor $M_{HS}$ is off and the low side switching transistor $M_{LS}$ is on, having an output transition from about Vdd to Vss. The high side cascode transistor $M_{HC}$ is still operating due to the charge of the gate source capacitance $C_{gshc}$, this capacitance $C_{gshc}$ has to be discharged. During this moment between t1 and t2 this transistor $M_{HC}$ will still work in the linear region and so dictate the output voltage change. The discharge current is provided by the low side cascode transistor $M_{LC}$. Because of the changing output voltage Vout, and consequently the changing drain voltage of the low side cascode transistor $M_{LC}$, the current through $M_{HC}$ will change. This results in a quadratic function for the output voltage Vout. When the high side cascode transistor $M_{HC}$ has been switched off as well, the low side cascode transistor $M_{LC}$ will work in its linear region and the output voltage change is now dictated by the charge current of the low side driver $M_{dls}$ and the gate drain capacitance $C_{dgls}$ of the low side switch transistor $M_{LS}$, Miller-effect. For a constant output change dV/dt, independent of the supply voltage, the driver currents should be independent of the supply voltage. This means that the driving signals of the drivers of the powers should have a fixed value; switching between Vss and $V_{dl}$ and Vdd-$V_{dh}$ and Vdd. Furthermore, the drive signal Vdrive should be shifted to a higher level for driving the high side power transistor $M_{HS}$. This is done by a level shifter. The level shifting however will also add some delay for the driving signal of the high side driver circuit $M_{dhr}$ and $M_{dhs}$. Therefore, a timing delay in the low side path has to be added to compensate for this effect.

It is observed that it is still not optimally controlled; the timing depends on the rest-charge of the parasitic gate capacitor $C_{gshc}$ and $C_{gslc}$ of the cascode transistors $M_{HC}$ and $M_{LC}$ and the output voltage changes in two steps adding higher frequency responses. Furthermore, the gate current of the cascode transistors $M_{HC}$ and $M_{LC}$ during the steep transition between t1-t2 and t5-t6 will be large. This means that the output resistance of the reference voltages VtabL and VtabH has to be low, resulting in larger quiescent currents of these reference voltages VtabL and VtabH.

Figure 4:
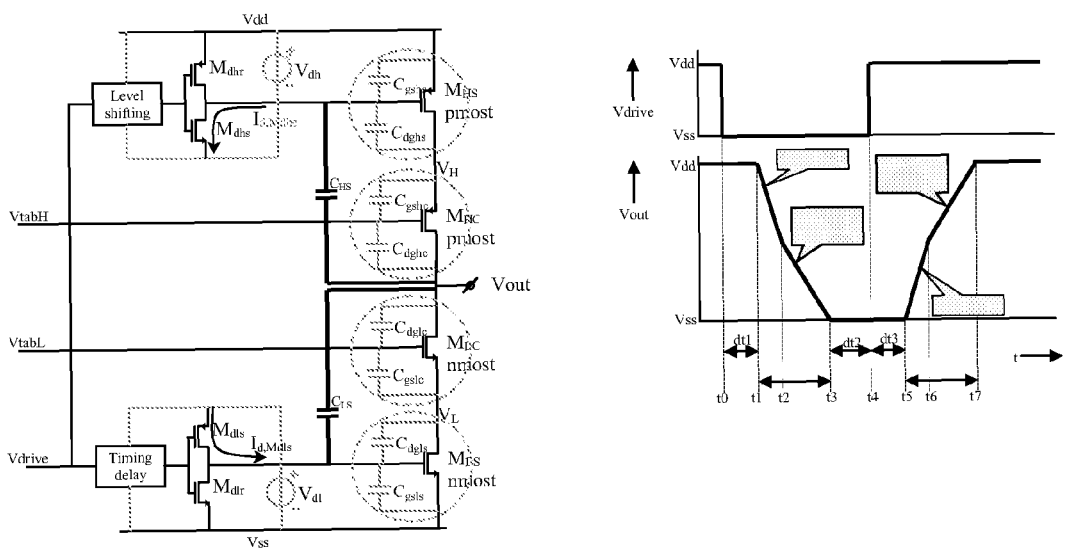
FIG. 4 depicts an embodiment of a power amplifier according to the invention.

FIG. 4 depicts an embodiment of a power amplifier according to the invention.

Figure 1:
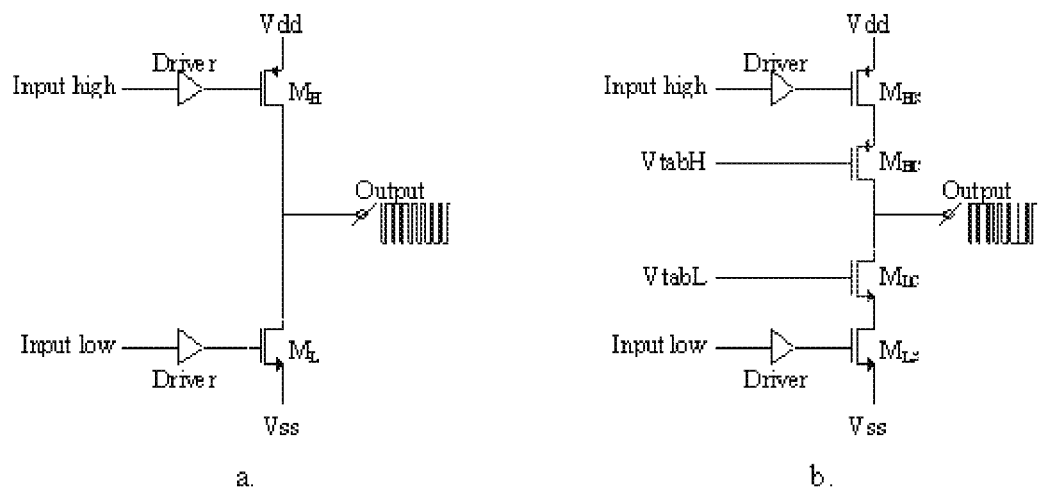
FIG. 1a depicts a prior-art class-D amplifier.
FIG. 1b depicts a prior-art cascoded class-D amplifier.
Figure 2:
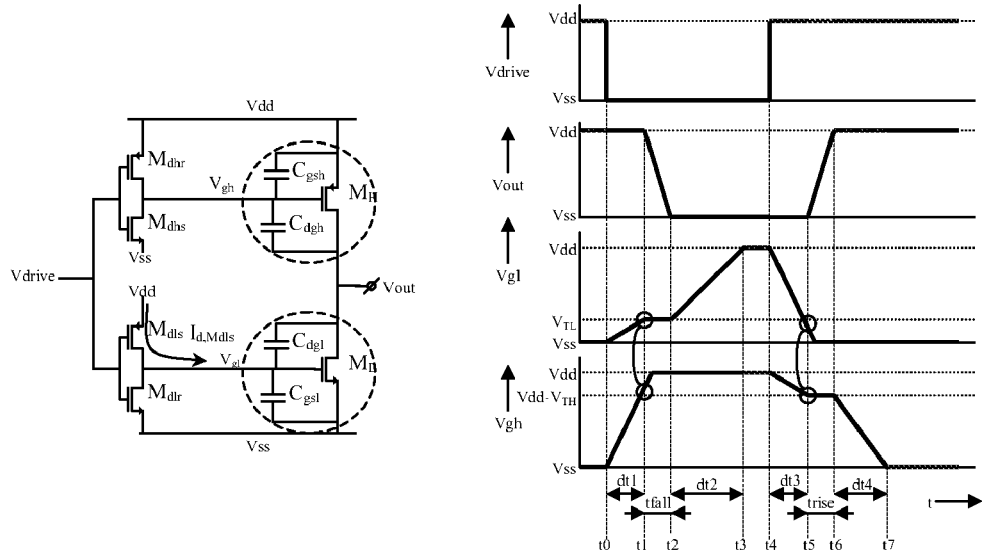
FIG. 2 depicts in more detail a prior class-D amplifier.

Adding two capacitors can make an improvement of the power amplifier as shown in FIG. 3. This will remove the quadratic function of the output voltage. In the single transistor output stage as shown in FIG. 2 the output flank is controlled by the charge current of $M_{dls}$ or $M_{dhs}$ and the total gate capacitor of the transistor $C_{gsl}$ or $C_{gsh}$ according to the Miller effect. Using cascoded transistors $M_{LC}$ and $M_{HC}$ as shown in FIG. 3, the Miller effect is removed but adding extra capacitors $C_{LS}$ and $C_{HS}$ as shown in FIG. 4 over the cascode transistors $M_{LC}$ and $M_{HC}$ will determine again the Miller effect. The output voltage Vout is again controlled by the charge current of the drivers $I_{dMdls}$ and $I_{dMdhs}$. First, it charges the extra capacitor $C_{LS}$ or $C_{HS}$ till the opposite cascode transistor $M_{HC}$ or $M_{LC}$ is switched off. Secondly, it charges both, the extra capacitor $C_{LS}$ or $C_{HS}$ and the total gate capacitor $C_{gsls}$ or $C_{gshs}$ of the driven switch transistor $M_{LS}$ or $M_{HS}$. This determines two different slopes of the output voltage change, as shown in FIG. 4. The switching is better controlled but still a bend in the output voltage can be seen, the output dV/dt changes by a factor two.

Figure 5:
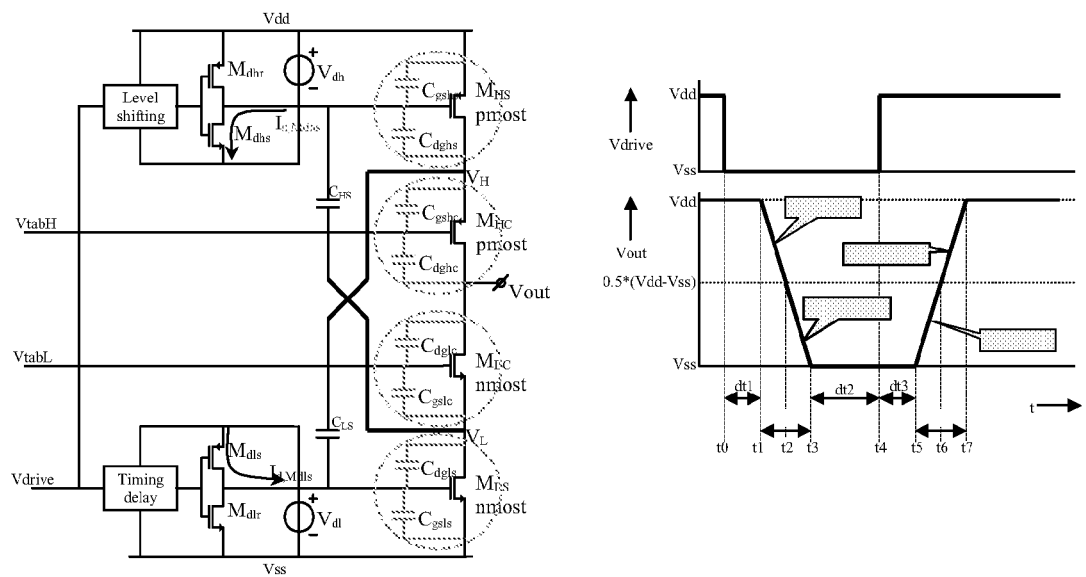
FIG. 5 depicts another embodiment of a power amplifier according to the invention.

FIG. 5 depicts another embodiment of a power amplifier according to the invention.

The flank of the output voltage Vout was already controlled by the power amplifier shown in FIG. 4, also with zero dead time techniques. Still, an improvement may be implemented made resulting in a better switching of the output stage. When the high side switch transistor $M_{HS}$ is switched off and the low side switch transistor $M_{LS}$ is switched on, the high side cascode transistor $M_{HC}$ is still in its linear region. The bend in the output voltage is at the moment the low side cascode transistor $M_{LC}$ goes into the linear region. Using this effect the output voltage can be completely controlled by connecting the extra capacitors $C_{LS}$ and $C_{HS}$ as shown in FIG. 5. The values of these capacitors are preferably matched to the gate-drain capacitors $C_{dgls}$ and $C_{dghs}$ of the switching transistors $M_{LS}$ and $M_{HS}$. This results in a linear output voltage change dVout/dt=constant, where the slope can be controlled by the driver current $I_{dMdls}$ and $I_{dMdhs}$. The take-over moment of the slope controlled by the extra capacitor $C_{HS}$ or $C_{LS}$ and the parasitic capacitor of the switching transistor $M_{HS}$ or $M_{LS}$ will be controlled by the cascode reference voltages VtabL and VtabH. For achieving a better slope of the output voltage Vout without any disturbance, the difference between these two reference voltages VtabL and VtabH should be as shown in equation 1.

$$V_{tabL} - V_{tabH} = V_{T,NMOS} + V_{T,PMOS} \quad [1]$$

The $V_{T,NMOS}$ has to match with the $V_T$ of transistor $M_{LC}$ and $V_{T,PMOS}$ with the $V_T$ of transistor $M_{HC}$, wherein the index T indicates a threshold voltage. For an optimal distribution of the supply voltage over the power transistors $M_{LS}$, $M_{LC}$, $M_{HC}$ and $M_{HS}$, the cascode reference voltages VtabL and VtabH are set around half the supply voltage, but it is not a must. A possible distribution may be as shown in equations 2, 3.

$$V_{tabL} = \frac{V_p}{2} + V_{T,NMOS} \quad [2]$$

$$V_{tabH} = \frac{V_p}{2} - V_{T,PMOS} \quad [3]$$

Figure 6:
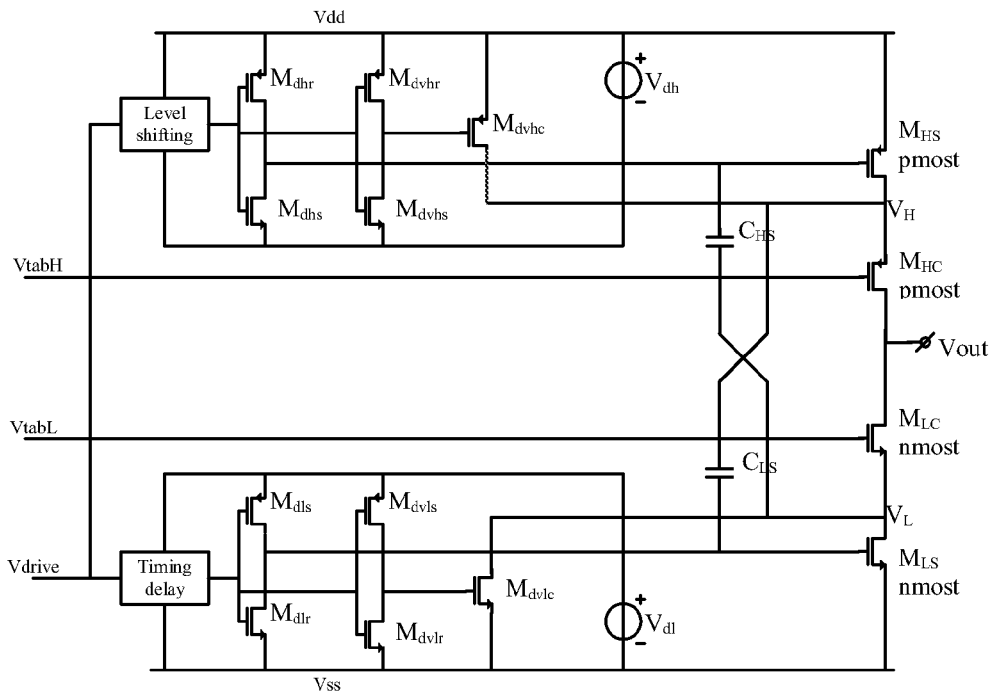
FIG. 6 depicts a more detailed embodiment of a power amplifier according to the invention.

It has to be noted that the threshold voltages $V_{T,NMOS}$ and $V_{T,PMOS}$ will be influenced by the body effect of the transistors since the source is not connected to the low supply voltage Vss. The extra capacitors $C_{LS}$ and $C_{HS}$ are working with the total supply voltage Vdd-Vss. Poly-capacitors may be used. In this case two series connected capacitors are used. A voltage divider may be used for controlling the voltage at the series connection between these capacitors. Also metal capacitors may be used. It is possible that these capacitors will not perfectly match the gate drain capacitors $C_{dgls}$ and $C_{dghs}$ of the transistors $M_{LS}$ and $M_{HS}$ but still they control the output voltage Vout. A mismatch between these capacitors $C_{dgls}$, $C_{dghs}$ on one hand and $C_{LS}$, $C_{HS}$, on the other hand will result in a very small bend of the output voltage transition. The internal voltages $V_L$ and $V_H$ will increase due to the capacitive division between e.g. $C_{HS}$, $C_{dgls}$ and $C_{gslc}$ and between $C_{LS}$, $C_{dghs}$ and $C_{gshc}$ during output voltage Vout transitions. Therefore, a small current is subtracted as shown in FIG. 6 This can be achieved by an inverter high side: $M_{dvhr}$ and $M_{dvhs}$; low side: $M_{dvlr}$ and $M_{dvls}$ and a small transistor high side: $M_{dvhc}$; low side: $M_{dvlc}$ for the high and low side. The currents of the control transistors $M_{dvlc}$ and $M_{dvhc}$ will only contribute during the transitions of the output voltage Vout.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A power amplifier comprising:
   a first transistor having a first control terminal and a first main current path coupled between a first supply terminal and a first node,
   a second transistor having a second control terminal and a second main current path coupled between a second supply terminal and a second node,
   a first controlled resistor coupled between the first node and an output node (Vout) of the amplifier,
   a second controlled resistor coupled between the second node and the output node (Vout) of the amplifier,
   the first transistor being controlled by a first driver comprising a level shifting circuit,
   the second transistor being controlled by a second driver including a time delaying circuit; and
   further comprising a first capacitor coupled between the first controlled terminal and the output node, the amplifier comprising a second capacitor coupled between the second controlled terminal and the output node.

2. A power amplifier as claimed in claim 1 further comprising a first capacitor coupled between the first controlled terminal and the second node, the amplifier comprising a second capacitor coupled between the second controlled terminal and the first node.

3. A power amplifier as claimed in claim 1 wherein the first and the second driver comprises a respective first and second controlled current source coupled to the respective level shifting circuit and to the delaying circuit, the first controlled current source providing current to the second node and to the first node and the second controlled current source providing current to the to the first node.

4. A power amplifier as claimed in claim 1, wherein the first controlled resistor and the second controlled resistor are MOS transistors.

5. A power amplifier as claimed in claim 3, wherein the first current source is coupled to the level shifting circuit via a first inverter and wherein the second current source is coupled to the delaying circuit via a second inverter.

6. A power amplifier as claimed in claim 1, wherein the first and the second capacitors are substantially equal to a gate drain capacitance of first and the second transistor, respectively.

7. A power amplifier comprising:
a first transistor having a first control terminal and a first main current path coupled between a first supply terminal and a first node,
a second transistor having a second control terminal and a second main current path coupled between a second supply terminal and a second node,
a first controlled resistor coupled between the first node and an output node (Vout) of the amplifier,
a second controlled resistor coupled between the second node and the output node (Vout) of the amplifier,
the first transistor being controlled by a first driver comprising a level shifting circuit,
the second transistor being controlled by a second driver including a time delaying circuit; and
further comprising a first capacitor coupled between the first controlled terminal and the second node, the amplifier comprising a second capacitor coupled between the second controlled terminal and the first node.

8. A power amplifier as claimed in claim 7 wherein the first and the second driver comprises a respective first and second controlled current source coupled to the respective level shifting circuit and to the delaying circuit, the first controlled current source providing current to the second node and to the first node and the second controlled current source providing current to the to the first node.

9. A power amplifier as claimed in claim 7, wherein the first controlled resistor and the second controlled resistor are MOS transistors.

10. A power amplifier as claimed in claim 8, wherein the first current source is coupled to the level shifting circuit via a first inverter and wherein the second current source is coupled to the delaying circuit via a second inverter.

11. A power amplifier as claimed in claim 7, wherein the first and the second capacitors are substantially equal to a gate drain capacitance of first and the second transistor, respectively.

12. A power amplifier comprising:
a first transistor having a first control terminal and a first main current path coupled between a first supply terminal and a first node,
a second transistor having a second control terminal and a second main current path coupled between a second supply terminal and a second node,
a first controlled resistor coupled between the first node and an output node (Vout) of the amplifier,
a second controlled resistor coupled between the second node and the output node (Vout) of the amplifier,
the first transistor being controlled by a first driver comprising a level shifting circuit, and
the second transistor being controlled by a second driver including a time delaying circuit;
wherein the first and the second driver comprises a respective first and second controlled current source coupled to the respective level shifting circuit and to the delaying circuit, the first controlled current source providing current to the second node and to the first node and the second controlled current source providing current to the to the first node.

13. A power amplifier as claimed in claim 12 further comprising a first capacitor coupled between the first controlled terminal and the output node, the amplifier comprising a second capacitor coupled between the second controlled terminal and the output node.

14. A power amplifier as claimed in claim 12 further comprising a first capacitor coupled between the first controlled terminal and the second node, the amplifier comprising a second capacitor coupled between the second controlled terminal and the first node.

15. A power amplifier as claimed in claim 12, wherein the first controlled resistor and the second controlled resistor are MOS transistors.

16. A power amplifier as claimed in claim 12, wherein the first current source is coupled to the level shifting circuit via a first inverter and wherein the second current source is coupled to the delaying circuit via a second inverter.

17. A power amplifier as claimed in claim 13, wherein the first and the second capacitors are substantially equal to a gate drain capacitance of first and the second transistor, respectively.

18. A power amplifier as claimed in claim 14, wherein the first and the second capacitors are substantially equal to a gate drain capacitance of first and the second transistor, respectively.

* * * * *